(12) United States Patent
Peng et al.

(10) Patent No.: US 12,273,103 B2
(45) Date of Patent: Apr. 8, 2025

(54) DRIVE CIRCUIT OF BRIDGE ARM SWITCHING TRANSISTOR, DRIVE CIRCUIT, AND POWER CONVERTER

(71) Applicant: HUAWEI TECHNOLOGIES CO., LTD., Guangdong (CN)

(72) Inventors: Xingqiang Peng, Shenzhen (CN); Shaoqing Dong, Dongguan (CN); Jing Wen, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 426 days.

(21) Appl. No.: 17/856,674

(22) Filed: Jul. 1, 2022

(65) Prior Publication Data

US 2023/0006668 A1  Jan. 5, 2023

(30) Foreign Application Priority Data

Jul. 2, 2021  (CN) .......................... 202110753639.7

(51) Int. Cl.
*H03K 17/687* (2006.01)
*H02M 7/5387* (2007.01)
*H03K 17/06* (2006.01)

(52) U.S. Cl.
CPC ........ *H03K 17/687* (2013.01); *H02M 7/5387* (2013.01); *H03K 17/06* (2013.01)

(58) Field of Classification Search
CPC .................................................. H03K 17/687
USPC ........................................................ 327/108
See application file for complete search history.

(56) References Cited

U.S. PATENT DOCUMENTS

2003/0231046 A1\* 12/2003 Giacomini ..... H03K 19/018557
327/333
2018/0211958 A1\* 7/2018 Chang ................... H01L 21/761

FOREIGN PATENT DOCUMENTS

| CN | 105321944 A | 2/2016 |
| JP | H0897706 A | 4/1996 |
| JP | 2006081255 A | 3/2006 |
| JP | 2009266933 A | 11/2009 |

\* cited by examiner

*Primary Examiner* — Tomi Skibinski
(74) *Attorney, Agent, or Firm* — WOMBLE BOND DICKINSON (US) LLP

(57) ABSTRACT

This application discloses a drive circuit of a bridge arm switching transistor, a drive circuit, and a power converter. The bridge arm switching transistor includes a first switching transistor and a second switching transistor. A first terminal of the first switching transistor is connected to a power supply, a second terminal of the first switching transistor is connected to a first terminal of the second switching transistor, and a second terminal of the second switching transistor is grounded. The drive circuit includes a low-voltage region and at least two high-voltage regions isolated which include a first high-voltage region and a second high-voltage region. A semiconductor device configured to drive the second switching transistor is disposed in the low-voltage region. P-type semiconductor devices are disposed in each of the first high-voltage region and the second high-voltage region, and the P-type semiconductor devices are configured to drive the first switching transistor.

17 Claims, 11 Drawing Sheets

DRIVE CIRCUIT OF BRIDGE ARM SWITCHING TRANSISTOR, DRIVE CIRCUIT, AND POWER CONVERTER

CROSS-REFERENCE TO RELATED APPLICATIONS

This application claims priority to Chinese Patent Application No. 202110753639.7, filed on Jul. 2, 2021, which is hereby incorporated by reference in its entirety.

TECHNICAL FIELD

This application relates to the field of power electronics technologies, and in particular, to a drive circuit of a bridge arm switching transistor, a drive circuit, and a power converter.

BACKGROUND

Currently, a bridge circuit is needed in many scenarios, for example, a rectifier circuit and an inverter circuit each may be implemented by using a bridge circuit, and the bridge circuit may be a half-bridge circuit or a full-bridge circuit. However, regardless of the half-bridge circuit or the full-bridge circuit, each bridge arm includes two switching transistors, namely, an upper switching transistor and a lower switching transistor. A first terminal of the upper switching transistor is connected to a positive electrode of a power supply, a second terminal of the upper switching transistor is connected to a first terminal of the lower switching transistor, and a second terminal of the lower switching transistor is grounded. Usually, when operating, the upper switching transistor and the lower switching transistor are alternately turned on but not turned on at the same time. In some embodiments, a voltage of the power supply is different. For example, the voltage of the power supply may range from dozens to hundreds of volts, and in a scenario with a high voltage, the voltage of the power supply may even be thousands of volts.

Because the upper switching transistor is directly connected to the power supply, when the upper switching transistor is turned on and the lower switching transistor is turned off, a voltage at the second terminal of the upper switching transistor is the voltage of the power supply. Otherwise, when the upper switching transistor is turned off and the lower switching transistor is turned on, the voltage at the second terminal of the upper switching transistor is the ground. It can be learned that, when the upper switching transistor is in different states, the voltage at the second terminal of the upper switching transistor is switched between the voltage of the power supply and the ground, and a change range of the voltage may reach hundreds of volts or even thousands of volts. That is, a higher voltage class of an application scenario of the bridge circuit indicates a greater fluctuation of a voltage change.

Currently, a switching transistor drive circuit in a high-voltage bridge circuit usually includes a high-voltage region, a low-voltage region, and a high-voltage isolation ring surrounding the high-voltage region. The high-voltage isolation ring is configured to isolate a floating voltage at a second terminal of an upper switching transistor. To be specific, a drive circuit of the upper switching transistor is integrated in the high-voltage region by using a semiconductor process, and a drive circuit of a lower switching transistor is integrated in the low-voltage region by using the semiconductor process. However, there are two different voltage domains in the high-voltage region, and P-type semiconductor devices in the different voltage domains have different bulk potential requirements. However, an independent P well for each P-type semiconductor device cannot be manufactured according to a current manufacturing process, and therefore, N well isolation of the P-type semiconductor devices in the different voltage domains cannot be implemented.

SUMMARY

To resolve the foregoing technical problems, this application provides a drive circuit of a bridge arm switching transistor, a drive circuit, and/or a power converter, to implement isolation of bulk potentials of P-type semiconductor devices in different voltage domains in a high-voltage region without changing an existing semiconductor manufacturing process, thereby avoiding interference between the P-type semiconductor devices in different voltage domains.

An embodiment of this application provides a drive circuit of a bridge arm switching transistor. The bridge arm switching transistor includes a first switching transistor and/or a second switching transistor. A first terminal of the first switching transistor is connected to a power supply, a second terminal of the first switching transistor is connected to a first terminal of the second switching transistor, and a second terminal of the second switching transistor is grounded. The drive circuit includes a low-voltage region and/or at least two high-voltage regions isolated by at least two isolation rings, where the at least two high-voltage regions include a first high-voltage region and a second high-voltage region. The first high-voltage region corresponds to a first voltage domain, the second high-voltage region corresponds to a second voltage domain, and/or a voltage of the first voltage domain is different from a voltage of the second voltage domain. A semiconductor device configured to drive the second switching transistor is disposed in the low-voltage region. P-type semiconductor devices are disposed in each of the first high-voltage region and the second high-voltage region, and/or the P-type semiconductor devices are configured to drive the first switching transistor. Because the first high-voltage region and the second high-voltage region are mutually isolated by the isolation rings, the P-type semiconductor devices disposed in the two high-voltage regions have N wells that are mutually isolated and independent of each other. Therefore, the P-type semiconductor devices in the two high-voltage regions do not interfere with each other.

The drive circuit provided in this embodiment of this application includes at least two isolation rings. For example, the drive circuit may include two isolation rings or more isolation rings, for example, three or four isolation rings. A quantity of isolation rings may be determined based on a quantity of different voltage domains included in a high-voltage region, that is, the quantity of isolation rings is the same as the quantity of voltage domains in the high-voltage region. A plurality of isolation rings may be manufactured at the same time, and/or a plurality of high-voltage regions may be formed at the same time. No additional semiconductor process is needed.

In the drive circuit provided in this embodiment of this application, at least two different isolation rings are disposed in a high-voltage region, to form at least two high-voltage regions, and each high-voltage region corresponds to one voltage domain, that is, a plurality of mutually isolated voltage domains are formed, and the mutually isolated voltage domains have different voltages. In this way, mutual isolation between P-type semiconductor devices in different voltage domains can be implemented, so that the P-type semiconductor devices in different voltage domains have different bulk potentials, thereby avoiding mutual interference between the P-type semiconductor devices in different voltage domains. In the drive circuit provided in this embodiment of this application, a requirement that the P-type semiconductor devices in different voltage domains have different bulk potentials can be implemented without changing an existing semiconductor process, so that the P-type semiconductor devices in different voltage domains have mutually isolated N wells. Therefore, the requirement that the P-type semiconductor devices in different voltage domains have different bulk potentials can be rapidly met in this manner. In some embodiments, a plurality of isolation rings may be manufactured at the same time, and a plurality of high-voltage regions may be formed at the same time. No additional semiconductor process is needed.

In some embodiments, the at least two isolation rings include a first isolation ring and a second isolation ring. The first isolation ring surrounds the first high-voltage region, and the second isolation ring surrounds the second high-voltage region. The low-voltage region is a region other than the first isolation ring and the second isolation ring. The first isolation ring and the second isolation ring are two independent isolation rings. In a possible manner, the low-voltage region exists between the first isolation ring and the second isolation ring.

In some embodiments, the first high-voltage region and the second high-voltage region need electric energy transmission and signal transmission, and signals include a drive signal and a control signal. Therefore, the drive circuit further includes bond wires, configured to transmit (e.g., provide, send, deliver) electric energy in the first high-voltage region to the second high-voltage region, and further configured to transmit the drive signal from the first high-voltage region to the second high-voltage region.

In some embodiments, the drive circuit further includes a voltage conversion circuit located in the first high-voltage region, and the voltage conversion circuit is configured to convert the voltage of the first voltage domain into the voltage of the second voltage domain. The bond wires are configured to connect an output voltage of the voltage conversion circuit to the second high-voltage region. The voltage conversion circuit may be a buck conversion circuit. In some embodiments, the voltage conversion circuit bucks the voltage of the first voltage domain, and transmits a bucked voltage to the second voltage domain through the bond wires, that is, the voltage of the second voltage domain is lower than the voltage of the first voltage domain.

In some embodiments, there are two implementations for the bond wires between the first high-voltage region and the second high-voltage region.

A first implementation is that the bond wires are directly bonded between a pad of the first high-voltage region and a pad of the second high-voltage region. This implementation is simple, and can implement internal wire bonding.

A second implementation is that a pad of the first high-voltage region is connected to a packaging pin of the drive circuit through the bond wire, and a pad of the second high-voltage region is connected to the packaging pin of the drive circuit through the bond wire, so that electric energy transmission and drive signal transmission are implemented between the first high-voltage region and the second high-voltage region. This implementation can implement an indirect connection through packaging.

In some embodiments, all the P-type semiconductor devices in the first high-voltage region have a same bulk potential. In some embodiments, all the P-type semiconductor devices in the first high-voltage region have a same N well, that is, the N well is shared. In this way, a process can be simplified, and manufacturing is simple. All the P-type semiconductor devices in the second high-voltage region have a same bulk potential. In some embodiments, all the P-type semiconductor devices in the second high-voltage region have a same N well, that is, the N well is shared. However, the two high-voltage regions do not share an N well. Therefore, signal interference caused by a same bulk potential can be avoided between the P-type semiconductor devices in the two high-voltage regions. An N-type semiconductor device in the first high-voltage region and an N-type semiconductor device in the second high-voltage region each have an independent P well. In some embodiments, each of N-type semiconductor devices in the two high-voltage regions and the low-voltage region has an independent P well.

In some embodiments, both the first isolation ring and the second isolation ring are silicon bases.

Because the drive circuit provided in this embodiment of this application includes the at least two high-voltage regions isolated by the at least two isolation rings, signal transmission exists between different high-voltage regions. For example, the first high-voltage region and the second high-voltage region are interconnected through the bond wires, and a parasitic inductance may be generated by each of the bond wires. In this case, interference is generated. To avoid the interference. In some embodiments, the first high-voltage region includes a first NMOS transistor and a second NMOS transistor. The first NMOS transistor and the second NMOS transistor are symmetrically disposed. The first NMOS transistor and the second NMOS transistor are separately connected to a mirrored common-mode suppression circuit in the second high-voltage region. The first NMOS transistor and the second NMOS transistor are alternately turned on, so that one of two branches of the mirrored common-mode suppression circuit in the second high-voltage region is turned on.

In some embodiments, the second high-voltage region includes a first branch and a second branch. The first branch includes a third NMOS transistor, a fifth NMOS transistor, and a first PMOS transistor. The second branch includes a fourth NMOS transistor, a sixth NMOS transistor, and a second PMOS transistor. Both a first terminal of the first NMOS transistor and a first terminal of the second NMOS transistor are connected to a reference ground of the first high-voltage region, a second terminal of the first NMOS transistor is connected to a second terminal of the third NMOS transistor through the bond wire, and both the second terminal of the third NMOS transistor and a second terminal of the fourth NMOS transistor are connected to a reference ground of the second high-voltage region. Both a first terminal of the third NMOS transistor and a first terminal of the fourth NMOS transistor are connected to the voltage of the second voltage region. A second terminal of the second NMOS transistor is connected to the second terminal of the fourth NMOS transistor through the bond wire. Both a first terminal of the first PMOS transistor and a first terminal of the second PMOS transistor are connected to the voltage of the second voltage region. A second terminal of the first PMOS transistor is connected to a control terminal of the fifth NMOS transistor, and a second terminal of the second PMOS transistor is connected to a control terminal of the sixth NMOS transistor. Both a first terminal of the fifth NMOS transistor and a first terminal of the sixth NMOS transistor are connected to the voltage of the second voltage region. A second terminal of the fifth NMOS transistor and a second terminal of the sixth NMOS transistor are separately connected to the reference ground of the second high-voltage region through one capacitor.

A mirrored differential circuit exists in each of two high-voltage basins, and the differential circuits are disposed to suppress common-mode signal interference generated by the two high-voltage basins. When potential conversion of the two high-voltage basins is inconsistent, a large common-mode signal is generated, and when a parasitic capacitance and the parasitic inductance of the bond wire do not match, the common-mode signal is converted into a differential-mode signal. In this case, the circuit fails. Therefore, the common-mode suppression circuit provided in this embodiment of this application can resolve the foregoing technical problem and avoid a case in which a common-mode signal is converted into a differential-mode signal.

In some embodiments, to ensure that more current flows into a load resistor side and reduce a signal transmission delay, a size of the third NMOS transistor is greater than a size of the fifth NMOS transistor, and a size of the fourth NMOS transistor is greater than a size of the sixth NMOS transistor.

An embodiment of this application further provides a drive circuit of a switching transistor. The drive circuit includes at least two high-voltage regions isolated by at least two isolation rings: a first high-voltage region and a second high-voltage region. The first high-voltage region corresponds to a first voltage domain, the second high-voltage region corresponds to a second voltage domain, and a voltage of the first voltage domain is different from a voltage of the second voltage domain. The first high-voltage region and the second high-voltage region each are configured to dispose a P-type semiconductor device, and the P-type semiconductor devices are configured to drive the first switching transistor. Because the first high-voltage region and the second high-voltage region are mutually isolated by the isolation rings, the P-type semiconductor devices disposed in the two high-voltage regions have N wells that are mutually isolated and independent of each other. Therefore, the P-type semiconductor devices in the two high-voltage regions do not interfere with each other.

In some embodiments, the drive circuit further includes bond wires. The bond wires are configured to transmit electric energy in the first high-voltage region to the second high-voltage region, and are further configured to transmit a drive signal from the first high-voltage region to the second high-voltage region.

In some embodiments, the drive circuit further includes a voltage conversion circuit. The voltage conversion circuit is located in the first high-voltage region, and the voltage conversion circuit is configured to convert the voltage of the first voltage domain into the voltage of the second voltage domain. The bond wires are configured to connect an output voltage of the voltage conversion circuit to the second high-voltage region.

In some embodiments, the bond wires are directly bonded between a pad of the first high-voltage region and a pad of the second high-voltage region.

In some embodiments, a pad of the first high-voltage region is connected to a packaging pin of the drive circuit through a bond wire, and a pad of the second high-voltage region is connected to the packaging pin of the drive circuit through a bond wire, so that electric energy transmission and drive signal transmission are implemented between the first high-voltage region and the second high-voltage region.

An embodiment of this application further provides a power converter. The power converter includes at least one half-bridge arm and at least one drive circuit described in the foregoing embodiments. The half-bridge arm includes a first switching transistor and a second switching transistor. A first terminal of the first switching transistor is connected to a power supply, a second terminal of the first switching transistor is connected to a first terminal of the second switching transistor, and a second terminal of the second switching transistor is grounded. The drive circuit is configured to drive an on/off state of each of the first switching transistor and the second switching transistor. The power converter is configured to perform voltage transformation on the power supply and output a transformed voltage.

This application has at least the following advantages:

In the drive circuit provided in embodiments of this application, at least two different isolation rings are disposed in a high-voltage region to form at least two high-voltage regions, and each high-voltage region corresponds to one voltage domain, that is, a plurality of mutually isolated voltage domains are formed. The mutually isolated voltage domains have different voltages, for example, the first voltage domain corresponds to a first voltage, and the second voltage domain corresponds to a second voltage. Corresponding P-type semiconductor devices are disposed in each voltage domain, so that mutual isolation between P-type semiconductor devices in different voltage domains can be implemented. For example, the P-type semiconductor devices disposed in the first voltage domain have an N well of the first voltage, the P-type semiconductor devices disposed in the second voltage domain have an N well of the second voltage, and N-type potentials of the P-type semiconductors device corresponding to the two voltage domains are different. Therefore, the P-type semiconductor devices in different voltage domains have different bulk potentials, thereby avoiding mutual interference between the P-type semiconductor devices in different voltage domains. In the drive circuits provided in embodiments of this application, a requirement that the P-type semiconductor devices in different voltage domains have different bulk potentials can be implemented without changing an existing semiconductor process, so that the P-type semiconductor devices in different voltage domains have mutually isolated N wells. Therefore, the requirement that the P-type semiconductor devices in different voltage domains have different bulk potentials can be rapidly met in this manner. In some embodiments, a plurality of isolation rings may be manufactured at the same time, and a plurality of high-voltage regions may be formed at the same time. No additional semiconductor process is needed.

DESCRIPTION OF EMBODIMENTS

The following describes the technical solutions in embodiments of this application with reference to the accompanying drawings in embodiments of this application.

Words such as "first" and "second" in the following descriptions are used merely for description purposes, and are not understood to indicate or imply relative importance or implicitly indicate a quantity of indicated technical features. Therefore, a feature limited by "first" or "second" may explicitly or implicitly include one or more features. In the descriptions of this application, unless otherwise specified, "a plurality of" means two or more than two.

In this application, unless otherwise specified and limited, a term "connection" should be understood broadly. For example, a "connection" may be a fixed connection, may be a detachable connection, or may be integration, and may be a direct connection or an indirect connection implemented by using an intermediate medium. In addition, a term "coupling" may be a manner of implementing an electrical connection of signal transmission. The "coupling" may be a direct electrical connection or may be an indirect electrical connection implemented by using an intermediate medium.

To enable a person skilled in the art to better understand technical solutions provided in embodiments of this application, the following first describes an application scenario of the technical solutions with reference to accompanying drawings.

Embodiments of this application relate to a drive circuit of a switching transistor, and in particular, to a drive circuit of a switching transistor in a bridge circuit. For example, the drive circuit may be configured to drive a switching transistor, in the bridge circuit, that is connected to a power supply.

Figure 1:
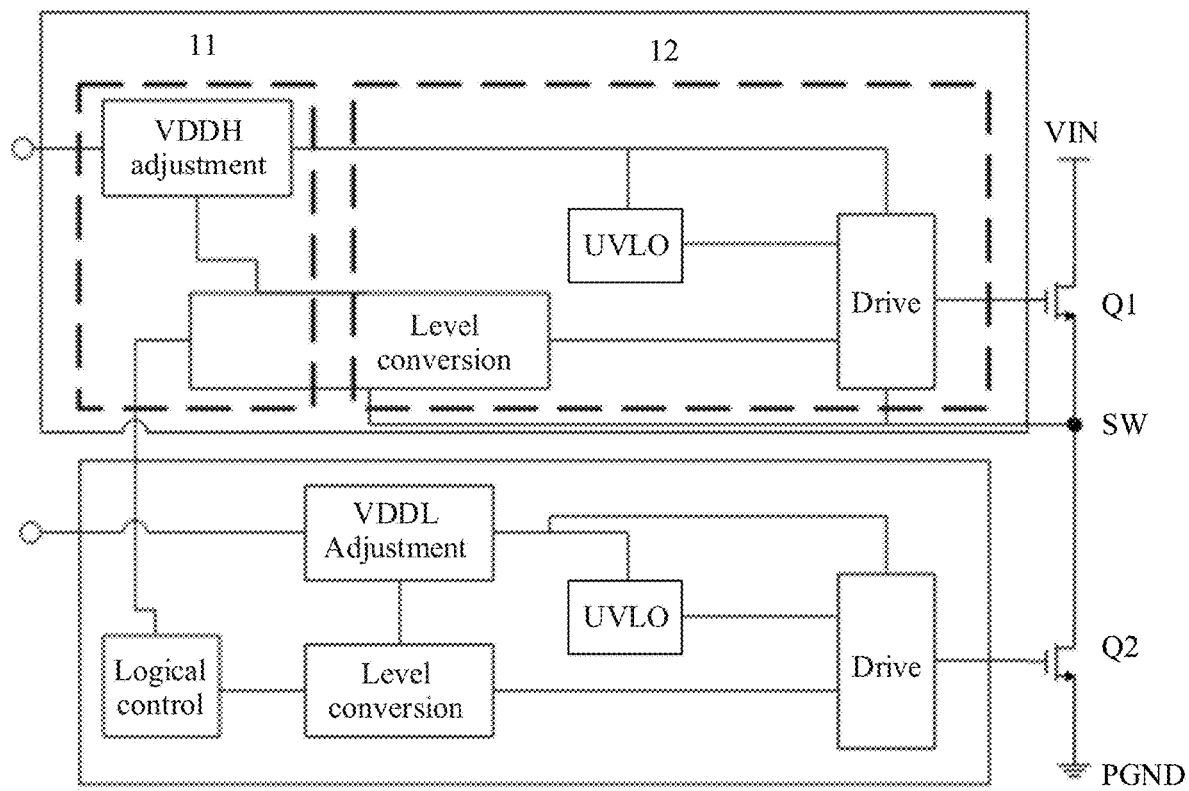
FIG. 1 is a schematic diagram of a drive circuit of a high-voltage bridge circuit according to an embodiment of this application.

FIG. 1 is a schematic diagram of a drive circuit of a high-voltage bridge circuit.

A high voltage mentioned in embodiments of this application is usually above hundreds of volts, for example, a voltage used in the field of electric vehicles, the field of photovoltaic power generation, or the field of secondary power supplies. A photovoltaic system is used as an example. Because a photovoltaic module outputs a direct current, an inverter needs to convert the direct current into an alternating current. Usually, the inverter includes a bridge circuit, and an input voltage of the inverter is usually at hundreds of volts or even thousands of volts. Therefore, a voltage connected to the bridge circuit is at hundreds of volts or even thousands of volts.

In FIG. 1, a half-bridge circuit is used as an example. The half-bridge circuit includes an upper switching transistor and a lower switching transistor that are connected in series, namely, a first switching transistor Q1 and a second switching transistor Q2. A first terminal of the first switching transistor Q1 is connected to a power supply VIN, a second terminal SW of the first switching transistor Q1 is connected to a first terminal of the second switching transistor Q2, and a second terminal of the second switching transistor Q2 is grounded PGND. A voltage class of the VIN is not limited in this embodiment of this application, for example, the voltage class may range from hundreds of volts to thousands of volts.

It can be seen from FIG. 1 that when the first switching transistor Q1 is turned on and the second switching transistor Q2 is turned off, a voltage at the SW point becomes a voltage of the VIN, and when the first switching transistor Q1 is turned off and the second switching transistor Q2 is turned on, the voltage at the SW point becomes a voltage of the PGND. It can be learned that the voltage at the SW point fluctuates between the VIN and the PGND when an on/off state of each of the two switching transistors is switched. To avoid an impact of voltage fluctuation at the SW point on a semiconductor device in a low-voltage region 20, an isolation ring is used to isolate a high-voltage region from the low-voltage region.

The drive circuit corresponding to the two switching transistors of the half-bridge circuit includes the high-voltage region 10 and the low-voltage region 20. Because a voltage connected to the first switching transistor Q1 is high and a voltage connected to the second switching transistor Q2 is low, the high-voltage region 10 corresponds to the first switching transistor Q1 and the low-voltage region 20 corresponds to the second switching transistor Q2. The high-voltage region 10 includes two different voltage domains, namely, a first voltage domain 11 and a second voltage domain 12, where the first voltage domain 11 corresponds to a voltage VB, and the second voltage domain 12 corresponds to a voltage VDDH.

Figure 2:
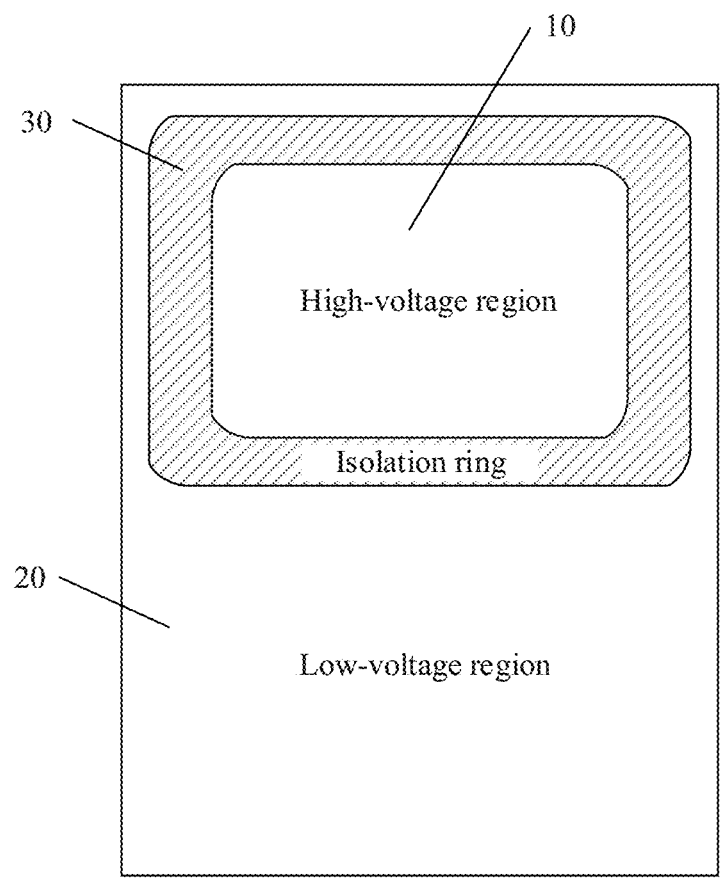
FIG. 2 is a schematic diagram of integration of the drive circuit corresponding to FIG. 1.

FIG. 2 is a schematic diagram of integration of the drive circuit corresponding to FIG. 1.

It can be seen from FIG. 2 that the drive circuit may be implemented in an actual product by using a semiconductor process to form an integrated circuit, and the integrated circuit includes a high-voltage region 10, a low-voltage region 20, and an isolation ring 30.

The integrated circuit uses a bulk silicon high voltage (BIPOLAR-CMOS-DMOS, BCD) process. The integrated circuit is usually integrated on a P-type substrate. To reduce the impact of voltage fluctuation at the SW point in FIG. 1 on the low-voltage region 20, the isolation ring 30 may be disposed, and the high-voltage region 10 and the low-voltage region 20 are isolated by the isolation ring 30.

Figure 3:
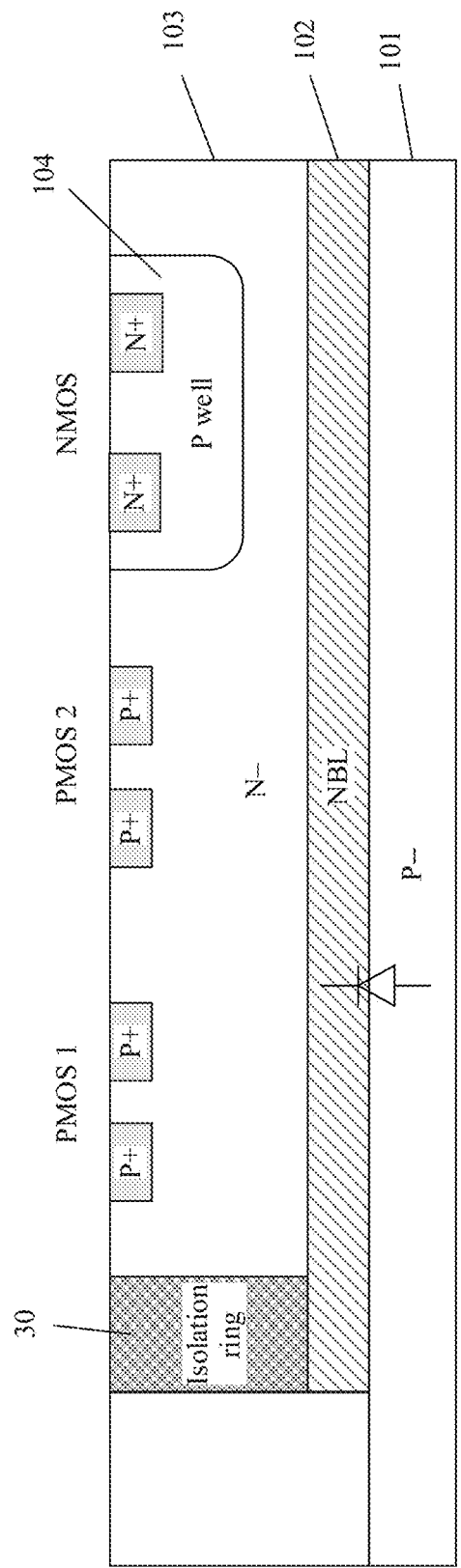
FIG. 3 is a schematic diagram of a cross section of an integrated circuit corresponding to FIG. 2.

FIG. 3 is a schematic diagram of a cross section of the integrated circuit corresponding to FIG. 2.

A left side of the isolation ring 30 is the low-voltage region, and a right side of the isolation ring 30 is the high-voltage region. This embodiment of this application mainly describes the high-voltage region part. The high-voltage region is connected to the P-type substrate 101 through an N-type buried layer (NBL) 102, and a voltage difference between the P-type substrate 101 and the high-voltage region is isolated by a reverse PN junction. The NBL is a first N-type buried layer.

It can be seen from FIG. 3 that, in the high-voltage region, an N-type semiconductor device uses an NMOS as an example. Each NMOS may be separately integrated in an independent P well 104, that is, each NMOS has an independent P well. FIG. 3 shows only one NMOS. Therefore, NMOSs with different bulk potentials can be manufactured by manufacturing a plurality of P wells.

A P-type semiconductor device uses a PMOS as an example. PMOSs are integrated in an N well 103 shared by the high-voltage region. For example, two PMOS transistors are respectively a PMOS 1 and a PMOS 2, and the PMOS 1 and the PMOS 2 share the same N well 103. The N well 103 of the PMOSs is implemented by using N-. The N- is a second N-type buried layer, and a difference between the NBL and the N- is that a doping concentration of the N- is higher than a doping concentration of the NBL. Therefore, in a current semiconductor process condition, all the P-type semiconductor devices in the high-voltage region have a same bulk potential.

Still refer to FIG. 1. The high-voltage region in a half-bridge arm includes two different voltage domains, and the two different voltage domains each include a PMOS. If the structure shown in FIG. 3 is used, different PMOSs have the same N well 103, and there is interference between the PMOSs in the two different voltage domains.

Therefore, a current semiconductor manufacturing process cannot meet a requirement that P-type semiconductor devices in different voltage domains have different bulk potentials. If the semiconductor manufacturing process is improved, a process step needs to be changed on a previous manufacturing production line, and a large amount of development time needs to be invested. Therefore, a requirement that different P-type semiconductor devices have different bulk potentials cannot be rapidly met.

Drive Circuit Embodiment of Bridge Arm Switching Transistor

To meet a requirement that different P-type semiconductor devices in a high-voltage drive circuit have different bulk potentials, in this embodiment of this application, when a drive circuit of a bridge arm switching transistor is manufactured, a plurality of isolation rings are manufactured based on a quantity of different voltage domains in a high-voltage region, that is, a quantity of voltage domains is the same as a quantity of isolation rings, and the voltage domains and the isolation rings are in a one-to-one correspondence. P-type semiconductor devices in a same voltage domain may be located in a region isolated by a same isolation ring, and P-type semiconductor devices in different voltage domains are located in different isolation rings, thereby avoiding mutual interference between the P-type semiconductor devices in different voltage domains.

As shown in FIG. 1, the high-voltage region in the drive circuit shown in FIG. 1 includes two voltage domains, where the two voltage domains respectively correspond to a first voltage VB and a second voltage VDDH, and the second voltage VDDH is obtained by performing buck conversion on the first voltage VB. Therefore, the second voltage VDDH is less than the first voltage VB. Therefore, in this embodiment of this application, P-type semiconductor devices connected to the first voltage VB and P-type semiconductor devices connected to the second voltage VDDH can be isolated by disposing two isolation rings. Because the isolation rings can be manufactured in a current semiconductor manufacturing process, the existing process does not need to be changed, and a time delay caused by changing and updating the process is avoided.

With reference to accompanying drawings, the following describes in detail implementations of a drive circuit of a bridge arm switching transistor provided in this embodiment of this application. Whether a bridge circuit is a half-bridge circuit or a full-bridge circuit is not limited in this embodiment of this application. For example, the half-bridge circuit includes one bridge arm, and the full-bridge circuit includes two bridge arms. In this embodiment of this application, only two switching transistors in one bridge arm are used as an example for description. An upper transistor and a lower transistor in the bridge arm each are implemented by using one switching transistor. In some embodiments, the upper transistor may be implemented by using at least two switching transistors, provided that a function of one switching transistor can be implemented, and the lower transistor is implemented in a similar manner. This is not limited in this embodiment of this application.

Figure 4:
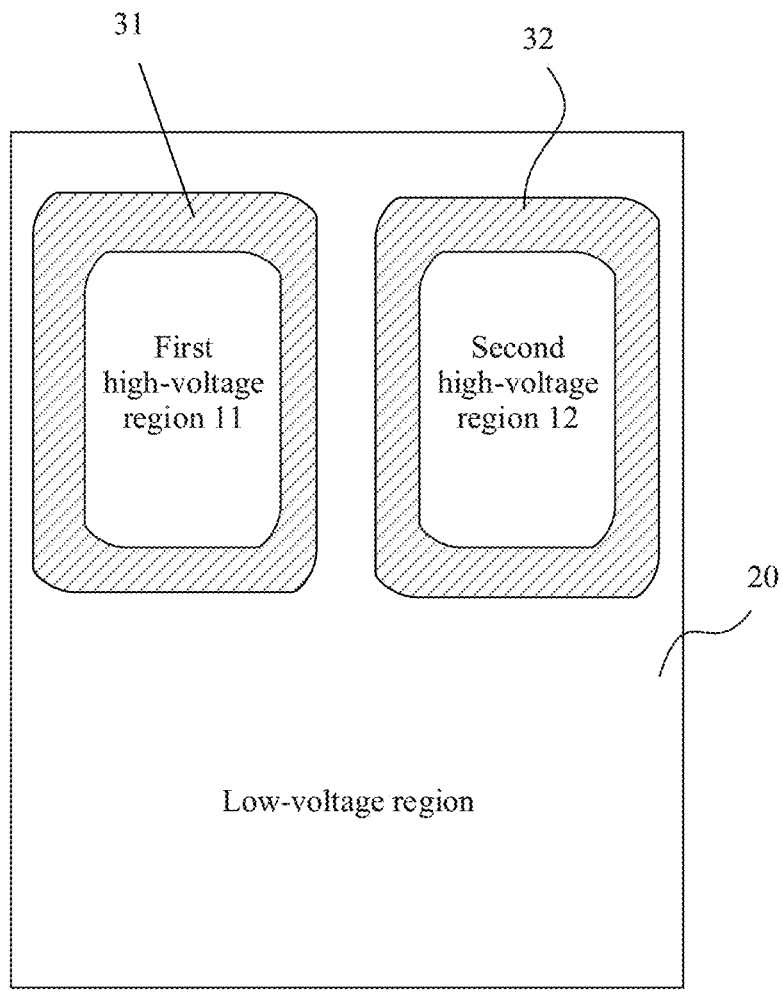
FIG. 4 is a schematic diagram of a drive circuit of a bridge arm switching transistor according to an embodiment of this application.

FIG. 4 is a schematic diagram of a drive circuit of a bridge arm switching transistor according to an embodiment of this application.

The drive circuit of a bridge arm switching transistor provided in this embodiment of this application is configured to output a drive signal to a gate of the bridge arm switching transistor, to control an on/off state of the bridge arm switching transistor. The bridge arm switching transistor includes a first switching transistor and a second switching transistor. A first terminal of the first switching transistor is connected to a power supply, a second terminal of the first switching transistor is connected to a first terminal of the second switching transistor, and a second terminal of the second switching transistor is grounded. For the first switching transistor and the second switching transistor, refer to FIG. 1. Details are not described herein again.

The drive circuit includes a low-voltage region 20 and at least two high-voltage regions isolated by at least two isolation rings. For example, the two isolation rings are respectively a first isolation ring 31 and a second isolation ring 32. A first high-voltage region 11 is isolated by the first isolation ring 31, and a second high-voltage region 12 is isolated by the second isolation ring 32. The first high-voltage region 11 corresponds to a first voltage domain, and the second high-voltage region 12 corresponds to a second voltage domain. A voltage of the first voltage domain is different from a voltage of the second voltage domain.

The low-voltage region 20 is configured to dispose a semiconductor device in the drive circuit to drive the second switching transistor. In other words, the semiconductor device that drives the second switching transistor is disposed in the low-voltage region 20.

The semiconductor device that is used in the drive circuit and that is configured to drive the second switching transistor is disposed in the low-voltage region.

The first high-voltage region 11 is configured to dispose P-type semiconductor devices of the first voltage domain in the drive circuit to drive the first switching transistor, and the second high-voltage region 12 is configured to dispose P-type semiconductor devices of the second voltage domain in the drive circuit to drive the first switching transistor. In other words, the P-type semiconductor devices of the first voltage domain are disposed in the first high-voltage region 11, and the P-type semiconductor devices of the second voltage domain are disposed in the second high-voltage region 12. The P-type semiconductor devices of the first voltage domain and the P-type semiconductor devices of the second voltage domain have different bulk potentials. In some embodiments, a voltage connected to the first switching transistor is higher than a voltage connected to the second switching transistor. Therefore, the first high-voltage region 11 and the second high-voltage region 12 each are configured to dispose semiconductor devices corresponding to the first switching transistor in the drive circuit.

In some embodiments, a high-voltage region includes at least two different voltage domains. Therefore, to enable P-type semiconductor devices in the voltage domains to have different bulk potentials, a plurality of isolation rings are disposed to isolate each voltage domain in this embodiment of this application. It should be understood that when there are more voltage domains, a larger quantity of isolation rings may be disposed. For example, three different voltage domains are respectively at 19 V, 6 V, and 3.3 V. The three different voltage domains may be isolated by three different isolation rings correspondingly.

In this embodiment of this application, two isolation rings are not limited. For ease of description, that a high-voltage region includes two different voltage domains is used as an example for description, and two isolation rings are correspondingly disposed, namely, the first isolation ring 31 and the second isolation ring 32.

In some embodiments, as shown in FIG. 4, the first isolation ring 31 surrounds the first high-voltage region 11, and the second isolation ring 32 surrounds the second high-voltage region 12. The low-voltage region 20 is a region other than the first isolation ring 31 and the second isolation ring 32. In some embodiments, the low-voltage region 20 surrounds the first isolation ring 31 and the second isolation ring 32. In some embodiments, two independent high-voltage basins (e.g., a high-voltage region may also be referred to as a high-voltage basin) may be manufactured in a same base 100, to implement isolation between two different voltage domains. For example, the first high-voltage region 11 isolated by the first isolation ring 31 corresponds to the first voltage domain VB-SW in FIG. 1, and the second high-voltage region 12 isolated by the second isolation ring 32 corresponds to the second voltage domain VDDH-SW in FIG. 1.

It can also be seen from FIG. 1 that electric energy transmission and signal transmission are needed between the first high-voltage region and the second high-voltage region. Therefore, electric energy transmission and signal transmission can be implemented between the two high-voltage regions by using bond wires. That is, the bond wires are configured to transmit electric energy in the first high-voltage region to the second high-voltage region, and are further configured to transmit a drive signal from the first high-voltage region to the second high-voltage region. For example, electric energy transmission refers to transmitting the VDDH from the first high-voltage region to the second high-voltage region. The VDDH is actually the VB obtained through conversion by a voltage conversion circuit in the first high-voltage region. Signal transmission refers to transmitting a drive signal of a switching transistor from the first high-voltage region to the second high-voltage region. That is, the drive circuit provided in this embodiment of this application further includes a voltage conversion circuit. The voltage conversion circuit is located in the first high-voltage region, and the voltage conversion circuit is configured to convert the voltage of the first voltage domain into the voltage of the second voltage domain. The bond wires are configured to connect an output voltage of the voltage conversion circuit to the second high-voltage region.

In some embodiments, the voltage conversion circuit may be implemented by using a linear voltage regulator circuit, and the linear voltage regulator circuit may implement both buck and voltage regulation.

The following uses examples to describe two implementations of electric energy transmission and signal transmission between the first high-voltage region and the second high-voltage region.

Figure 5:
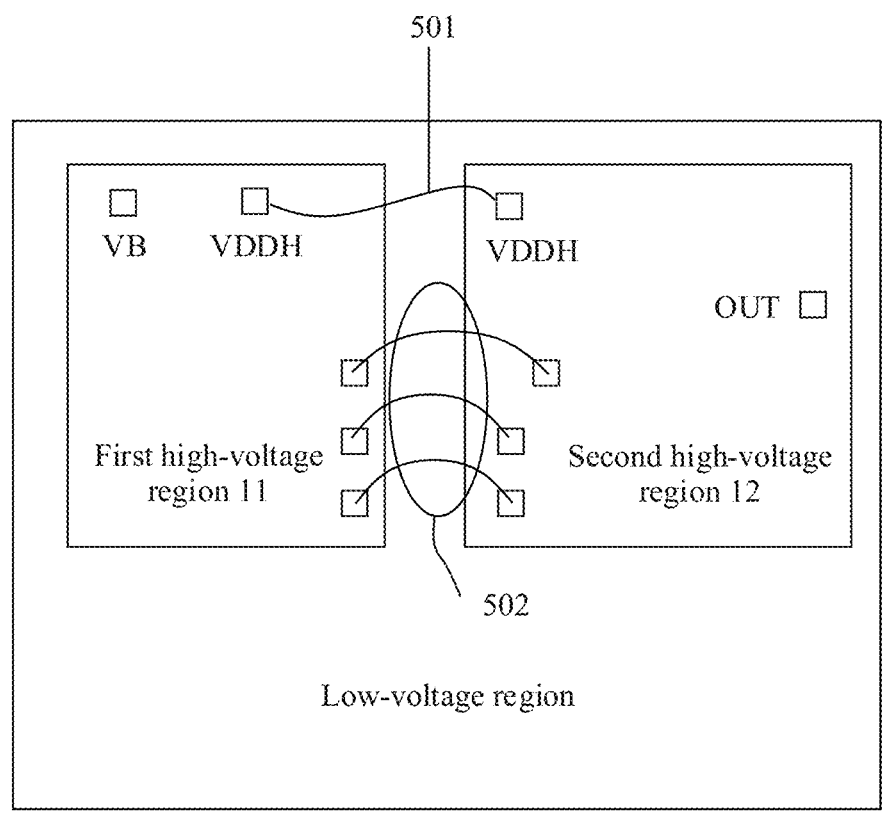
FIG. 5 is a schematic diagram of implementing interconnection between two high-voltage regions according to an embodiment of this application.

A first implementation is as follows:

FIG. 5 is a schematic diagram of implementing interconnection between the two high-voltage regions according to an embodiment of this application.

As shown in FIG. 5, the bond wires are directly bonded between a pad PAD of the first high-voltage region 11 and a pad PAD of the second high-voltage region 12. In some embodiments, a voltage VDDH of the first high-voltage region 11 is directly connected to VDDH of the second high-voltage region 12 through a bond wire 501, and all the bond wires are bonded on the pads to implement interconnection. Similarly, signal transmission between the first high-voltage region 11 and the second high-voltage region 12 is also directly implemented by bonding bond wires 502 on the pads.

In some embodiments, in addition to being directly implemented by using the bond wires on the pads, electric energy transmission and signal transmission between the first high-voltage region 11 and the second high-voltage region 12 can be alternatively implemented by using packaging pins. The following performs description in detail with reference to an accompanying drawing.

Figure 6:
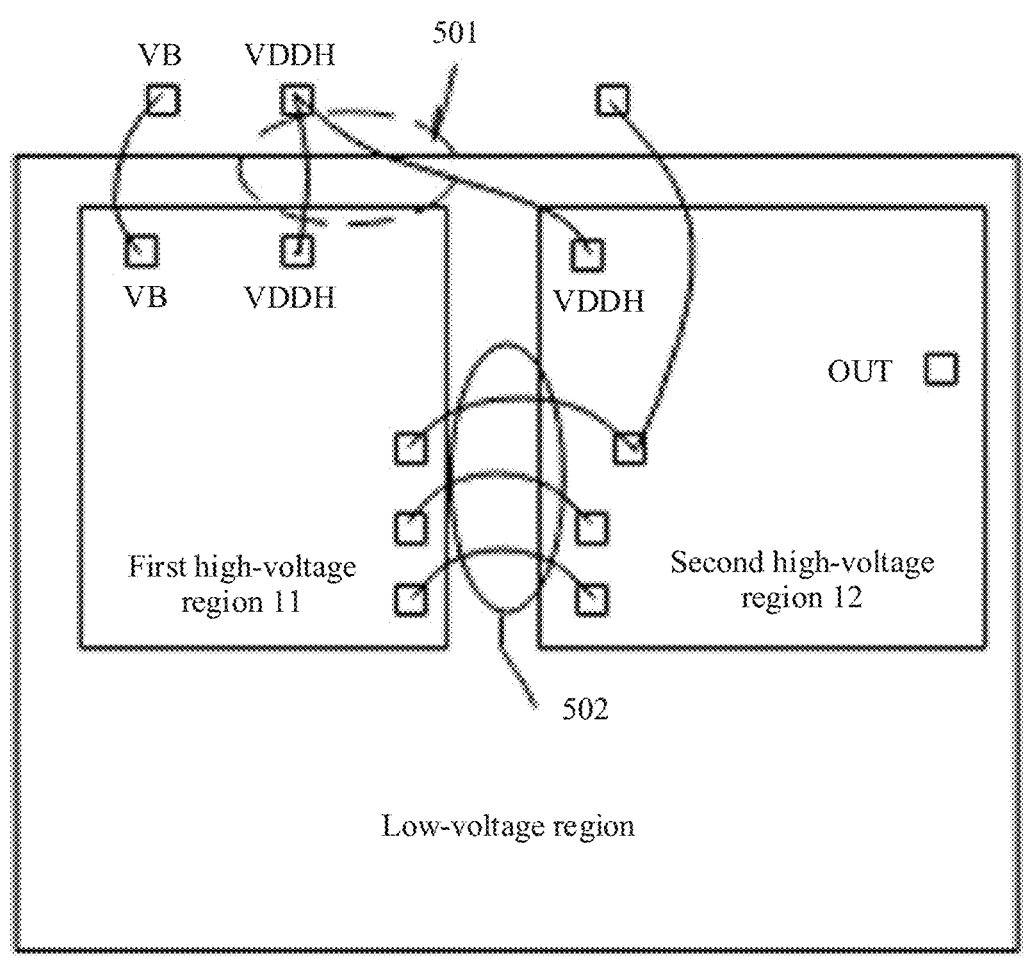
FIG. 6 is a schematic diagram of implementing interconnection between two high-voltage regions according to an embodiment of this application.

A second implementation is as follows:

FIG. 6 is a schematic diagram of implementing interconnection between the two high-voltage regions according to an embodiment of this application.

It can be seen from FIG. 6 that packaging pins of the drive circuit are disposed as a VB pin and a VDDH pin. A pad of the first high-voltage region 11 is connected to the packaging pin VDDH of the drive circuit through a bond wire 501, and a pad of the second high-voltage region 12 is also connected to the packaging pin VDDH of the drive circuit through a bond wire 501, to implement an electrical connection between the VDDH of the first high-voltage region 11 and the VDDH of the second high-voltage region 12. Similarly, drive signal interconnection between the first high-voltage region 11 and the second high-voltage region 12 may also be implemented by using a packaging pin, that is, in this embodiment, electric energy transmission and drive signal transmission are implemented between the first high-voltage region and the second high-voltage region by using packaging pins.

It should be understood that the foregoing is merely an example for description. Electric energy transmission and drive signal transmission between the first high-voltage region and the second high-voltage region may be implemented in different interconnection manners. For example, electric energy transmission is implemented by using a packaging pin, and drive signal interconnection is implemented by directly bonding bond wires.

To enable a person skilled in the art to better understand the drive circuit of a bridge arm switching transistor provided in this embodiment of this application, the following performs description with reference to a diagram of a cross section.

Figure 7:
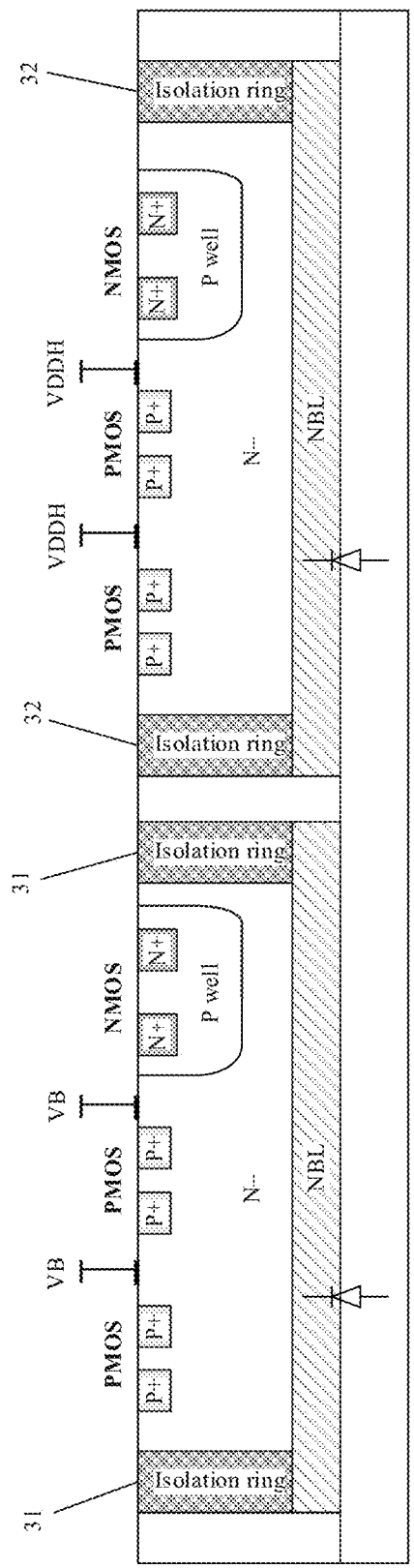
FIG. 7 is a diagram of a cross section of a drive circuit including a plurality of isolation rings according to an embodiment of this application.

FIG. 7 is a diagram of a cross section of a drive circuit including a plurality of isolation rings according to an embodiment of this application.

In FIG. 7, that the drive circuit includes two isolation rings is still used as an example for description, namely, the first isolation ring 31 and the second isolation ring 32.

The first isolation ring 31 corresponds to a first voltage domain VB, and the second isolation ring 32 corresponds to a second voltage domain VDDH. The first isolation ring 31 isolates the first high-voltage region, the second isolation ring 32 isolates the second high-voltage region, all the P-type semiconductor devices in the first high-voltage region have a same bulk potential, and all the P-type semiconductor devices in the second high-voltage region have a same bulk potential. An N-type semiconductor device in the first high-voltage region and an N-type semiconductor device in the second high-voltage region each have an independent P well.

The first isolation ring 31 and the second isolation ring 32 are mutually insulated. Therefore, PMOSs in the first high-voltage region isolated by the first isolation ring 31 and PMOSs in the second high-voltage region isolated by the second isolation ring 32 are mutually isolated. Therefore, the PMOS transistors in the two high-voltage regions have different bulk potentials, that is, PMOS transistors in different voltage domains have different bulk potentials, thereby avoiding interference caused by a same bulk potential.

In the drive circuit provided in this embodiment of this application, at least two different isolation rings are disposed in a high-voltage region, to isolate two different voltage domains, and corresponding PMOSs are disposed in each voltage domain. In this way, PMOSs in different voltage domains can be mutually isolated, so that the PMOSs in different voltage domains have different bulk potentials, thereby avoiding mutual interference. In the drive circuit provided in this embodiment of this application, a requirement that the PMOSs in different voltage domains have different bulk potentials can be implemented without changing an existing semiconductor process, so that the PMOSs in different voltage domains have mutually isolated N wells. Therefore, the requirement that the PMOSs in different voltage domains have different bulk potentials can be rapidly met in this manner. In some embodiments, a plurality of isolation rings may be manufactured at the same time, and a plurality of high-voltage regions may be formed at the same time. No additional semiconductor process is needed.

A material of the isolation rings is not limited in this embodiment of this application. For example, both the first isolation ring and the second isolation ring may be silicon bases.

Because the drive circuit provided in this embodiment of this application includes the at least two high-voltage regions isolated by the at least two isolation rings, signal transmission exists between different high-voltage regions. For example, the first high-voltage region and the second high-voltage region are interconnected through the bond wires, and a parasitic inductance may be generated by each of the bond wires. In this case, interference is generated. To avoid the interference, this embodiment of this application further provides an interference resolving solution. The following describes the solution in detail with reference to an accompanying drawing.

Figure 8:
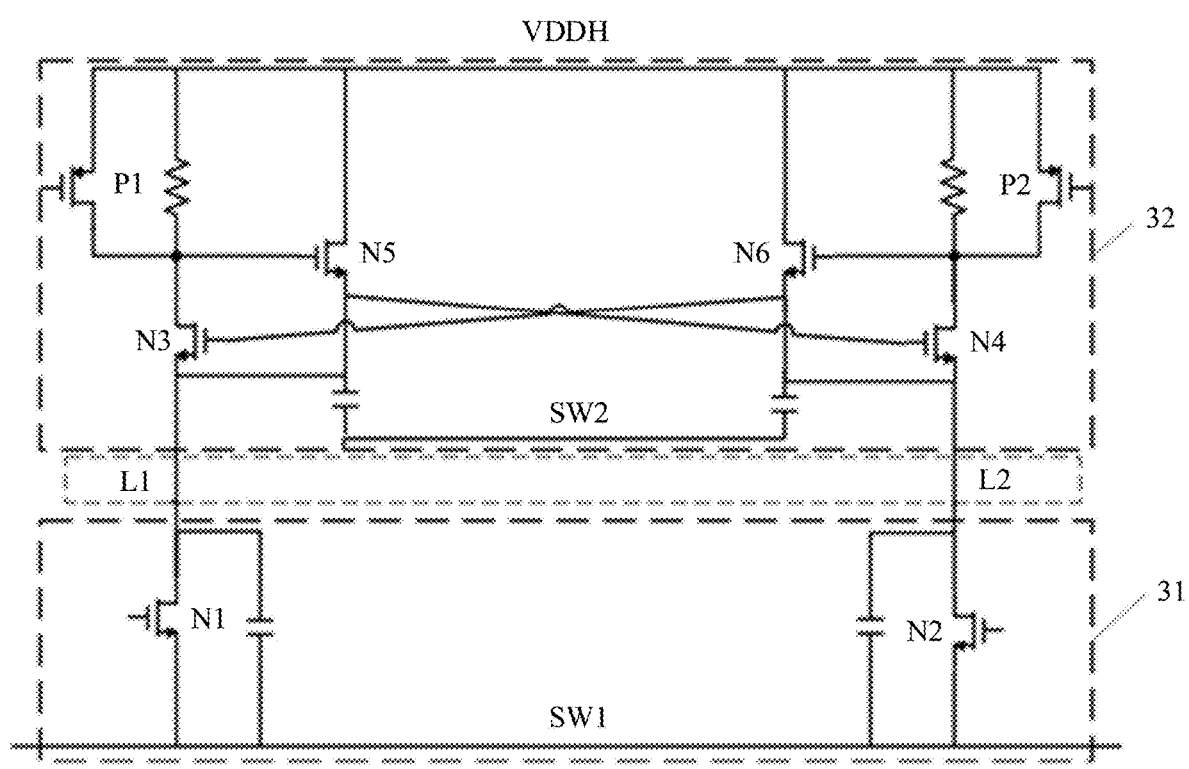
FIG. 8 is a schematic diagram of another drive circuit according to an embodiment of this application.

FIG. 8 is a schematic diagram of another drive circuit according to an embodiment of this application.

The first high-voltage region 31 (sometimes referred to as, "first isolation ring") provided in this embodiment of this application includes a first NMOS transistor N1 and a second NMOS transistor N2. It can be seen from FIG. 8 that the first NMOS transistor N1 and the second NMOS transistor N2 are symmetrically disposed. The first NMOS transistor N1 and the second NMOS transistor N2 are separately connected to a mirrored common-mode suppression circuit in the second high-voltage region 32. The second high-voltage region 32 (sometimes referred to as, "second isolation ring") corresponds to the voltage VDDH, a reference ground of the first high-voltage region 31 is SW1, and a reference ground of the second high-voltage region is SW2.

In actual operation, a pulse drive signal corresponding to the first NMOS transistor N1 and a pulse drive signal corresponding to the second NMOS transistor N2 are complementary to each other, and the first NMOS transistor N1 and the second NMOS transistor N2 are complementarily turned on, so that a drive signal of the bridge arm switching transistor is transmitted to the first switching transistor of a bridge arm, namely, the Q1 in FIG. 1, through the common-mode suppression circuit in the second high-voltage region 32.

The first NMOS transistor N1 and the second NMOS transistor N2 are alternately turned on to turn on one of two branches of the mirrored common-mode suppression circuit in the second high-voltage region 32. The common-mode suppression circuit in the second high-voltage region 32 is also a mirrored symmetric circuit. The following describes the common-mode suppression circuit included in the second high-voltage region 32.

The second high-voltage region includes a first branch and a second branch.

The first branch includes a third NMOS transistor N3, a fifth NMOS transistor N5, and a first PMOS transistor P1. The second branch includes a fourth NMOS transistor N4, a sixth NMOS transistor N6, and a second PMOS transistor P2.

Both a first terminal of the first NMOS transistor N1 and a first terminal of the second NMOS transistor N2 are connected to the reference ground SW2 of the first high-voltage region, a second terminal of the first NMOS transistor N1 is connected to a second terminal of the third NMOS transistor N3 through a bond wire L1, and both the second terminal of the third NMOS transistor N3 and a second terminal of the fourth NMOS transistor N4 are connected to the reference ground SW1 of the second high-voltage region 32. Both a first terminal of the third NMOS transistor N3 and a first terminal of the fourth NMOS transistor N4 are connected to the voltage VDDH of the second high-voltage region 32. A second terminal of the second NMOS transistor N2 is connected to the second terminal of the fourth NMOS transistor N4 through a bond wire L2.

Both a first terminal of the first PMOS transistor P1 and a first terminal of the second PMOS transistor P2 are connected to the voltage VDDH of the second voltage region. A second terminal of the first PMOS transistor P1 is connected to a control terminal of the fifth NMOS transistor N5, and a second terminal of the second PMOS transistor P2 is connected to a control terminal of the sixth NMOS transistor N6. Both a first terminal of the fifth NMOS transistor N5 and a first terminal of the sixth NMOS transistor N6 are connected to the voltage VDDH of the second voltage region. A second terminal of the fifth NMOS transistor N5 and a second terminal of the sixth NMOS transistor N6 are separately connected to the reference ground SW2 of the second high-voltage region 32 through one capacitor. It should be understood that, for each of the NMOSs and the PMOSs, a control terminal refers to a gate of a MOS transistor.

Figure 9:
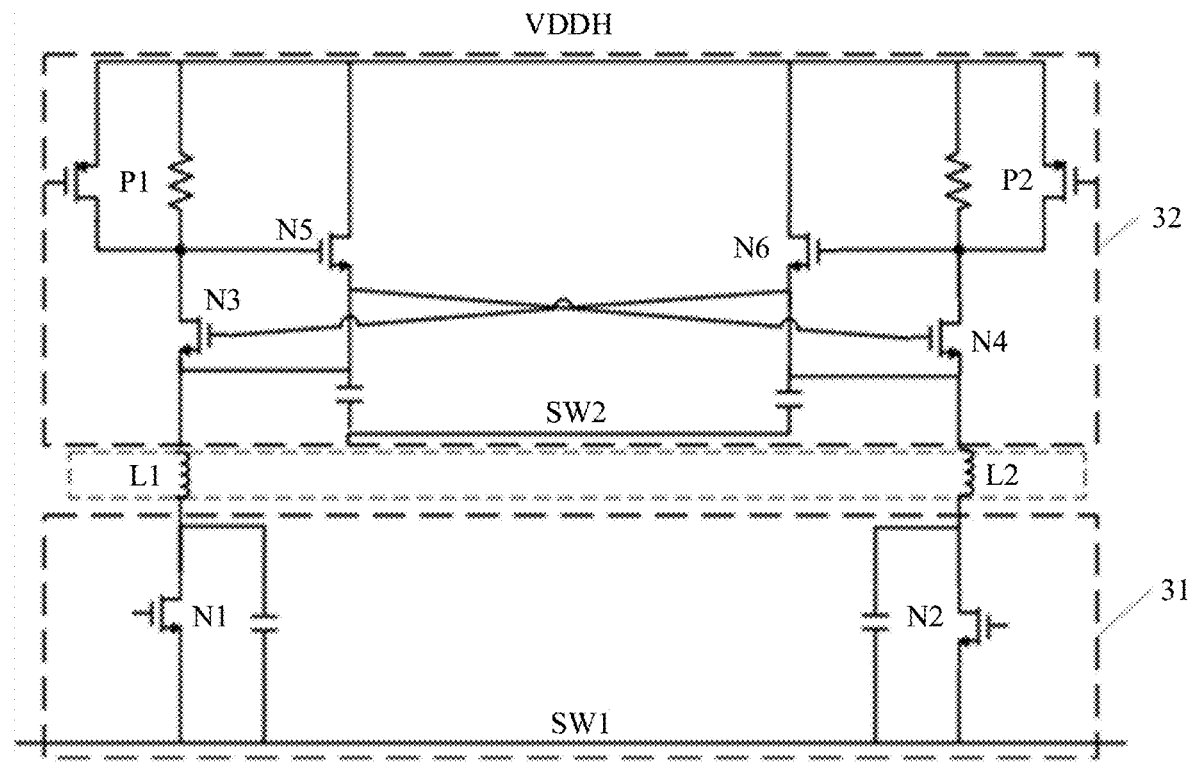
FIG. 9 is a schematic diagram of an equivalent circuit corresponding to FIG. 8.

The bond wires in FIG. 8 are represented by L1 and L2. However, in an actual product, a quantity of bond wires is not specifically limited. The bond wires need to be connected to the pads, and parasitic capacitances exist. Capacitances in FIG. 8 and FIG. 9 are parasitic capacitances. When a mismatch exists in a bond wire, a parasitic inductance is generated. As shown in FIG. 9, the L1 and the L2 each are equivalent to a parasitic inductance. To reduce an impact caused by a mismatch in a bond wire, the drive circuit provided in this embodiment of this application includes at least two high-voltage basins. A common-mode signal occurs when potential conversion of the two high-voltage basins is inconsistent.

A mirrored differential circuit exists in each of the two high-voltage basins, and the differential circuits are disposed to suppress common-mode signal interference generated by the two high-voltage basins. When the potential conversion of the two high-voltage basins is inconsistent, a large common-mode signal is generated, and when a parasitic capacitance and a parasitic inductance of a bond wire do not match, the common-mode signal is converted into a differential-mode signal. In this case, the circuit fails. Therefore, the common-mode suppression circuit provided in this embodiment of this application can resolve the foregoing technical problem and avoid a case in which a common-mode signal is converted into a differential-mode signal.

In actual operation, a drive signal of the first switching transistor is transmitted from the first high-voltage region to the second high-voltage region, and the second high-voltage region transmits the drive signal to the first switching transistor. To ensure that the drive signal is accurately transmitted to the first switching transistor, the common-mode suppression circuit needs to perform common-mode signal suppression. The following describes a specific operation principle.

In actual operation, a controller alternately sends a drive signal to the first NMOS transistor N1 and the second NMOS transistor N2, so that the first NMOS transistor N1 and the second NMOS transistor N2 are alternately turned on. In other words, the first NMOS transistor N1 and the second NMOS transistor N2 are not turned on at the same time. When the first NMOS transistor N1 is turned on, the second NMOS transistor N2 is turned off. Otherwise, when the second NMOS transistor N2 is turned on, the first NMOS transistor N1 is turned off. If the first NMOS transistor N1 and the second NMOS transistor N2 are turned on at the same time, potentials of output voltages on both left and right sides of the mirrored circuit in the second high-voltage region are pulled down at the same time, and an error occurs in the drive signal transmitted to the first switching transistor in the bridge arm. In this application, to avoid a case in which a signal failure occurs when the first NMOS transistor N1 and the second NMOS transistor N2 are turned on at the same time, the third NMOS transistor N3 and the fourth NMOS transistor N4 are designed. In some embodiments, when the first NMOS transistor N1 and the second NMOS transistor N2 are turned on at the same time, the third NMOS transistor N3 and the fourth NMOS transistor N4 are disconnected at the same time, that is, turned off, so that signals on the two sides are prevented from being pulled down at the same time.

In normal operation, only one of the N1 and the N2 is turned on. When the N1 is turned on, the N3 is turned on, and a path is formed on the left side, so that a signal is transmitted from the first high-voltage region to the second high-voltage region.

In some embodiments, to reset a parasitic capacitance, the fifth NMOS transistor N5 and the sixth NMOS transistor N6 are designed. Because parasitic capacitances exist at interfaces of the L1 and the L2, a recovery rate of a potential of a source of each of the third NMOS transistor N3 and the fourth NMOS transistor N4 is affected. In this case, the fifth NMOS transistor N5 and the sixth NMOS transistor N6 can accelerate potential reset.

FIG. 8 and FIG. 9 each show a mirrored circuit. Therefore, a left circuit in FIG. 9 is used as an example to describe an operation time sequence of each MOS transistor.

When the N1 is turned on and the N3 is turned on, a potential of a resistance on the left side is pulled down, and a signal is effectively established. After the potential of the resistance is pulled down, the P1 is turned on. A drive pulse of the N1 is a narrow pulse, and the N1 is switched from on to off. In this case, the N3 is continuously turned on, and the P1 is continuously turned on when the N3 is not turned off. In this case, the N5 is turned on, so that a source of the N3 is reset, and the N3 is switched from on to off.

In some embodiments, to avoid a signal transmission delay problem that may be caused by adding a MOS transistor, a size of the third NMOS transistor N3 may be greater than a size of the fifth NMOS transistor N5, and a size of the fourth NMOS transistor N4 is greater than a size of the sixth NMOS transistor N6. The sizes of the N3 and the N4 are greater than the sizes of the N5 and the N6 to ensure that more current flows into a load resistor side, thereby reducing a signal transmission delay.

Drive Circuit Embodiment

Based on the drive circuit of a bridge arm switching transistor that is provided in the foregoing embodiment and that is configured to drive a switching transistor of a bridge arm, an embodiment of this application further provides a drive circuit of a switching transistor, to drive any switching transistor that needs to be driven. The following performs description in detail with reference to accompanying drawings.

Figure 10:
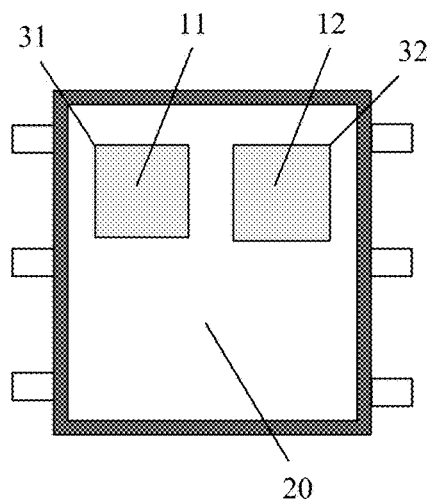
FIG. 10 is a schematic diagram of a drive circuit of a bridge arm switching transistor according to an embodiment of this application.

FIG. 10 is a schematic diagram of a drive circuit of a switching transistor according to an embodiment of this application.

It should be understood that one drive circuit may drive a plurality of switching transistors or may drive one switching transistor. This is not specifically limited in this embodiment of this application. In some embodiments, an application scenario of a driven switching transistor is not specifically limited. The driven switching transistor may be any switching transistor that needs to be driven, but a voltage connected to the switching transistor is high. Therefore, a plurality of different voltage domains exist in the drive circuit.

The following uses an example in which the drive circuit drives an upper switching transistor of a bridge arm circuit, namely, a first switching transistor, for description. A voltage connected to the upper switching transistor of the bridge arm circuit is high, and an on/off state of the switching transistor affects a voltage fluctuation at a midpoint of a bridge arm. Therefore, to suppress an impact of the voltage fluctuation and enable P-type semiconductor devices in different voltage domains in the drive circuit to have different bulk potentials, namely, different bodies, and mutually isolated N wells, the drive circuit provided in this embodiment of this application includes a plurality of isolation rings, so that a plurality of voltage regions are isolated. Different voltage regions each may be configured to place P-type semiconductor devices of a corresponding bulk potential.

The drive circuit of a bridge arm switching transistor provided in this embodiment of this application is configured to output a drive signal to a gate of the switching transistor, to control the on/off state of the switching transistor.

The drive circuit includes at least two high-voltage regions isolated by at least two isolation rings: a first high-voltage region 11 and a second high-voltage region 12. As shown in FIG. 10, two isolation rings are used as an example. A first isolation ring 31 isolates the first high-voltage region 11, and a second isolation ring 32 isolates the second high-voltage region 12. The first high-voltage region corresponds to a first voltage domain, the second high-voltage region corresponds to a second voltage domain, and a voltage of the first voltage domain is different from a voltage of the second voltage domain.

The first high-voltage region 11 is configured to dispose P-type semiconductor devices of the first voltage domain in the drive circuit. The second high-voltage region 12 is configured to dispose P-type semiconductor devices of the second voltage domain in the drive circuit. In other words, the P-type semiconductor devices of the first voltage domain are disposed in the first high-voltage region 11, and the P-type semiconductor devices of the second voltage domain are disposed in the second high-voltage region 12. Because two different high-voltage regions are mutually isolated, the P-type semiconductor devices located in the first voltage domain and the P-type semiconductor devices located in the second voltage domain have different bulk potentials, that is, have mutually isolated different N wells.

In the drive circuit provided in this embodiment of this application, at least two different isolation rings are disposed in a high-voltage region, to form at least two high-voltage regions, and each high-voltage region corresponds to one voltage domain, that is, a plurality of mutually isolated voltage domains are formed. Corresponding PMOSs are disposed in each voltage domain. In this way, mutual isolation between PMOSs in different voltage domains can be implemented, so that the PMOSs in different voltage domains have different bulk potentials, thereby avoiding mutual interference between the PMOSs in different voltage domains. In the drive circuit provided in this embodiment of this application, a requirement that the PMOSs in different voltage domains have different bulk potentials can be implemented without changing an existing semiconductor process, so that the PMOSs in different voltage domains have mutually isolated N wells. Therefore, the requirement that the PMOSs in different voltage domains have different bulk potentials can be rapidly met in this manner. In some embodiments, a plurality of isolation rings may be manufactured at the same time, and a plurality of high-voltage regions may be formed at the same time. No additional semiconductor process is needed.

Figure 11:
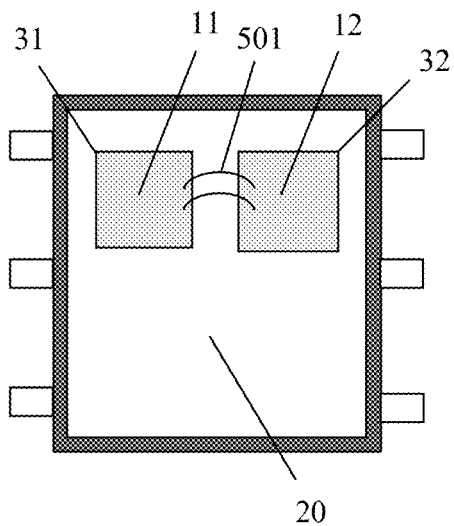
FIG. 11 is a schematic diagram of another drive circuit according to an embodiment of this application.

In some embodiments, the drive circuit provided in this embodiment of this application includes two mutually isolated high-voltage regions. In some embodiments, electric energy transmission and drive signal transmission need to be performed between the high-voltage regions. Therefore, bond wires need to be connected between different high-voltage regions. FIG. 11 is a schematic diagram of another drive circuit according to an embodiment of this application.

The drive circuit provided in this embodiment of this application further includes bond wires 501. The bond wires 501 are directly bonded between a pad of the first high-voltage region and a pad of the second high-voltage region.

The bond wires 501 are configured to transmit electric energy in the first high-voltage region 11 to the second high-voltage region 12, and are further configured to transmit a drive signal from the first high-voltage region 11 to the second high-voltage region 12. For drive signal and electric energy transmission, refer to the descriptions of the foregoing drive circuit embodiment. Details are not described herein again.

In FIG. 11, electric energy and drive signal transmission between the first high-voltage region 11 and the second high-voltage region 12 are directly implemented by using the bond wires 501. In some embodiments, in another implementation, electric energy and drive signal transmission between the first high-voltage region 11 and the second high-voltage region 12 may be implemented by using packaging pins and the bond wires. The following describes the another implementation in detail with reference to an accompanying drawing.

Figure 12:
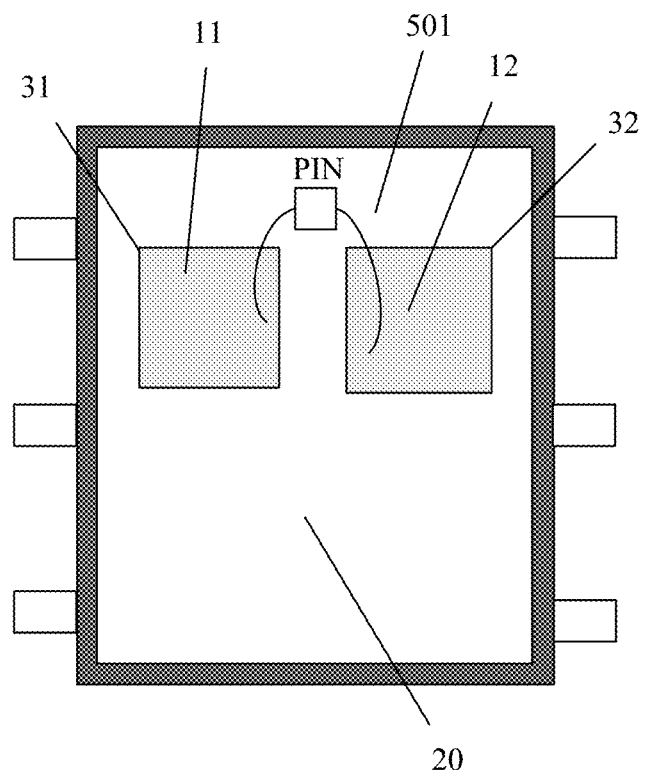
FIG. 12 is a schematic diagram of another drive circuit according to an embodiment of this application.

FIG. 12 is a schematic diagram of another drive circuit according to an embodiment of this application.

Bond wires 501 included in the drive circuit provided in this embodiment of this application are configured to implement electric energy and drive signal transmission between the first high-voltage region 11 and the second high-voltage region 12. In some embodiments, the first high-voltage region 11 is connected to a packaging pin through the bond wire 501, and the second high-voltage region 12 is connected to the packaging pin through the bond wire 501, to implement interconnection between the first high-voltage region 11 and the second high-voltage region 12. That is, a pad of the first high-voltage region 11 is connected to the packaging pin of the drive circuit through the bond wire 501, and a pad of the second high-voltage region 12 is connected to the packaging pin of the drive circuit through the bond wire 501, so that electric energy transmission and drive signal transmission are implemented between the first high-voltage region 11 and the second high-voltage region 12.

In some embodiments, the drive circuit provided in this embodiment of this application further includes a voltage conversion circuit (not shown in the figure).

The voltage conversion circuit is located in the first high-voltage region, and the voltage conversion circuit is configured to convert the voltage of the first voltage domain into the voltage of the second voltage domain. The bond wires are configured to connect an output voltage of the voltage conversion circuit to the second high-voltage region. In some embodiments, the voltage conversion circuit may be, for example, a linear voltage regulator circuit, to implement both a buck function and a voltage regulation function.

In some embodiments, to suppress a common-mode signal between different high-voltage regions, the drive circuit provided in this embodiment of this application may alternatively include the common-mode suppression circuit described in FIG. 8. Details are not described herein again.

In some embodiments, the drive circuits provided in the foregoing embodiments of this application each may be manufactured as a device, for example, in a form of a chip, or may be used as a circuit. A specific form of a product of the drive circuit is not specifically limited in embodiments of this application.

Power Converter Embodiment

Based on the drive circuit of a bridge arm switching transistor and the drive circuit provided in the foregoing embodiments, an embodiment of this application further provides a power converter. The following describes the power converter in detail with reference to an accompanying drawing.

Figure 13:
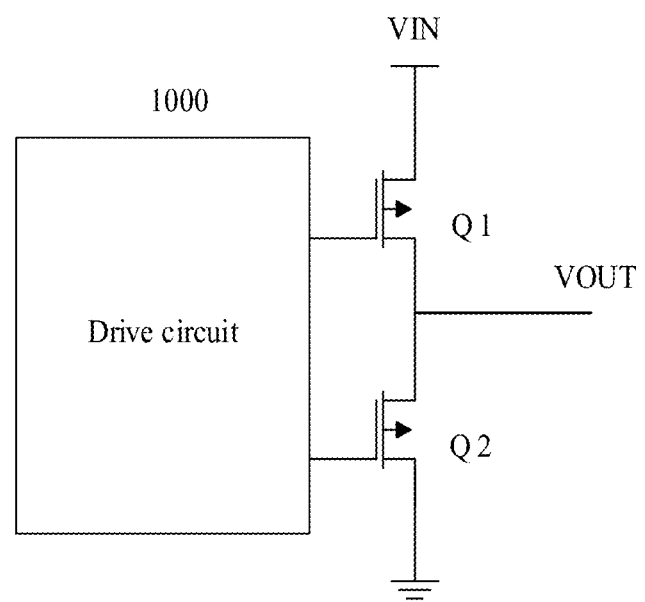
FIG. 13 is a schematic diagram of a power converter according to an embodiment of this application.

FIG. 13 is a schematic diagram of a power converter according to an embodiment of this application.

The power converter provided in this embodiment of this application includes at least one half-bridge arm and at least one drive circuit of a bridge arm switching transistor described in the foregoing embodiment or at least one drive circuit described in the foregoing embodiment.

The half-bridge arm includes a first switching transistor Q1 and a second switching transistor Q2.

A first terminal of the first switching transistor Q1 is connected to a power supply VIN, a second terminal of the first switching transistor Q1 is connected to a first terminal of the second switching transistor Q2, and a second terminal of the second switching transistor W2 is grounded.

The drive circuit 1000 is configured to drive an on/off state of each of the first switching transistor Q1 and the second switching transistor Q2.

The power converter is configured to perform voltage transformation on the power supply VIN and output a transformed voltage. That is, the second terminal of the first switching transistor Q1 is an output terminal of the power converter, namely, VOUT.

In the drive circuit included in the power converter provided in this embodiment of this application, at least two isolation rings are disposed in a high-voltage region, namely, a part that is of the drive circuit and that corresponds to the first switching transistor, to isolate at least two high-voltage regions. P-type semiconductor devices are disposed in different high-voltage regions based on voltage domains corresponding to the P-type semiconductor devices. In this way, it can be ensured that P-type semiconductor devices in different voltage domains have different bulk potentials, thereby avoiding mutual influence and interference between the P-type semiconductor devices in different voltage domains. Because a drive circuit in this embodiment of this application can avoid mutual interference between the P-type semiconductor devices, an accurate drive signal can be output to drive the on/off state of the first switching transistor, so that the power converter better performs electric energy conversion.

In some embodiments, the power converter may be a direct current-to-direct current converter, may be a direct current-to-alternating current converter, or may be an alternating current-to-direct current converter. A specific type of the power converter is not specifically limited in this application. In some embodiments, the power converter may include one bridge arm, namely, a half-bridge power converter. In some embodiments, the power converter may include two bridge arms, namely, a full-bridge power converter.

An application scenario of the power converter is not specifically limited in this embodiment of this application. For example, the power converter may be used in a photovoltaic power generation system or may be applied to the field of secondary power supplies, for example, an air conditioner power supply system of a data center includes the power converter. In some embodiments, the power converter may be alternatively used in a system that supplies power to a communication base station. Details are not described herein again.

It should be understood that in this application, "at least one (item)" means one or more, and "a plurality of" means two or more. The term "and/or" is used to describe an association relationship between associated objects, and indicates that three relationships may exist. For example, "A and/or B" may indicate the following three cases: Only A exists, only B exists, and both A and B exist, where A and B may be singular or plural. The character "/" generally indicates an "or" relationship between the associated objects. "At least one of the following items (pieces)" or a similar expression thereof indicates any combination of these items, including a single item (piece) or any combination of a plurality of items (pieces). For example, at least one of a, b, or c may indicate a, b, c, "a and b", "a and c", "b and c", or "a, b, and c", where a, b, and c may be singular or plural.

The foregoing descriptions are merely example embodiments of this application, but are not intended to limit this application in any form. Although the example embodiments of this application are disclosed above, embodiments are not intended to limit this application. By using the method and the technical content disclosed above, any person skilled in the art can make a plurality of possible changes and modifications on the technical solutions of this application, or amend the technical solutions thereof to be embodiments with equal effects through equivalent variations without departing from the protection scope of the technical solutions of this application. Therefore, any simple amendment, equivalent variation, and modification made on the above embodiments according to the technical essence of this application without departing from the content of the technical solutions of this application shall fall within the protection scope of the technical solutions of this application.

What is claimed is:

1. A drive circuit of a bridge arm switching transistor, wherein the bridge arm switching transistor comprises a first switching transistor and a second switching transistor, a first terminal of the first switching transistor is connected to a power supply, a second terminal of the first switching transistor is connected to a first terminal of the second switching transistor, and a second terminal of the second switching transistor is grounded;

the drive circuit comprises a low-voltage region and at least two high-voltage regions isolated by at least two isolation rings, wherein the at least two high-voltage regions comprise a first high-voltage region and a second high-voltage region, the first high-voltage region corresponds to a first voltage domain, the second high-voltage region corresponds to a second voltage domain, and a voltage of the first voltage domain is different from a voltage of the second voltage domain;

a semiconductor device configured to drive the second switching transistor is disposed in the low-voltage region; and P-type semiconductor devices are disposed in each of the first high-voltage region and the second high-voltage region, and the P-type semiconductor devices are configured to drive the first switching transistor.

2. The drive circuit according to claim 1, wherein the at least two isolation rings comprise a first isolation ring and a second isolation ring;

the first isolation ring surrounds the first high-voltage region, and the second isolation ring surrounds the second high-voltage region; and the low-voltage region is a region other than the first isolation ring and the second isolation ring.

3. The drive circuit according to claim 2, wherein both the first isolation ring and the second isolation ring are silicon bases.

4. The drive circuit according to claim 1, further comprising bond wires, wherein the bond wires are configured to transmit electric energy in the first high-voltage region to the second high-voltage region, and transmit a drive signal from the first high-voltage region to the second high-voltage region.

5. The drive circuit according to claim 4, further comprising a voltage conversion circuit, wherein
the voltage conversion circuit is located in the first high-voltage region, and the voltage conversion circuit is configured to convert the voltage of the first voltage domain into the voltage of the second voltage domain; and
the bond wires are configured to connect an output voltage of the voltage conversion circuit to the second high-voltage region.

6. The drive circuit according to claim 4, wherein the bond wires are directly bonded between a pad of the first high-voltage region and a pad of the second high-voltage region.

7. The drive circuit according to claim 4, wherein a pad of the first high-voltage region is connected to a packaging pin of the drive circuit through the bond wire, and a pad of the second high-voltage region is connected to the packaging pin of the drive circuit through the bond wire, so that electric energy transmission and drive signal transmission are implemented between the first high-voltage region and the second high-voltage region.

8. The drive circuit according to claim 1, wherein all the P-type semiconductor devices in the first high-voltage region have a same bulk potential, all the P-type semiconductor devices in the second high-voltage region have a same bulk potential, and an N-type semiconductor device in the first high-voltage region and an N-type semiconductor device in the second high-voltage region each have an independent P well.

9. The drive circuit according to claim 1, wherein the first high-voltage region comprises a first NMOS transistor and a second NMOS transistor;
the first NMOS transistor and the second NMOS transistor are symmetrically disposed;
the first NMOS transistor and the second NMOS transistor are separately connected to a mirrored common-mode suppression circuit in the second high-voltage region; and
the first NMOS transistor and the second NMOS transistor are alternately turned on, so that one of two branches of the mirrored common-mode suppression circuit in the second high-voltage region is turned on.

10. The drive circuit according to claim 9, wherein the second high-voltage region comprises a first branch and a second branch;
the first branch comprises a third NMOS transistor, a fifth NMOS transistor, and a first PMOS transistor, and the second branch comprises a fourth NMOS transistor, a sixth NMOS transistor, and a second PMOS transistor;
both a first terminal of the first NMOS transistor and a first terminal of the second NMOS transistor are connected to a reference ground of the first high-voltage region, a second terminal of the first NMOS transistor is connected to a second terminal of the third NMOS transistor through a bond wire, both the second terminal of the third NMOS transistor and a second terminal of the fourth NMOS transistor are connected to a reference ground of the second high-voltage region, both a first terminal of the third NMOS transistor and a first terminal of the fourth NMOS transistor are connected to the voltage of the second high-voltage region, and a second terminal of the second NMOS transistor is connected to the second terminal of the fourth NMOS transistor through a bond wire; and
both a first terminal of the first PMOS transistor and a first terminal of the second PMOS transistor are connected to the voltage of the second high-voltage region, a second terminal of the first PMOS transistor is connected to a control terminal of the fifth NMOS transistor, a second terminal of the second PMOS transistor is connected to a control terminal of the sixth NMOS transistor, both a first terminal of the fifth NMOS transistor and a first terminal of the sixth NMOS transistor are connected to the voltage of the second high-voltage region, and a second terminal of the fifth NMOS transistor and a second terminal of the sixth NMOS transistor are separately connected to the reference ground of the second high-voltage region through one capacitor.

11. The drive circuit according to claim 10, wherein a size of the third NMOS transistor is greater than a size of the fifth NMOS transistor, and a size of the fourth NMOS transistor is greater than a size of the sixth NMOS transistor.

12. A drive circuit of a switching transistor, comprising:
at least two high-voltage regions isolated by at least two isolation rings, including a first high-voltage region and a second high-voltage region, wherein the first high-voltage region corresponds to a first voltage domain, the second high-voltage region corresponds to a second voltage domain, and a voltage of the first voltage domain is different from a voltage of the second voltage domain; and
P-type semiconductor devices are disposed in each of the first high-voltage region and the second high-voltage region, and the P-type semiconductor devices are configured to drive the switching transistor.

13. The drive circuit according to claim 12, further comprising bond wires, wherein
the bond wires are configured to transmit electric energy in the first high-voltage region to the second high-voltage region, and transmit a drive signal from the first high-voltage region to the second high-voltage region.

14. The drive circuit according to claim 13, further comprising a voltage conversion circuit, wherein
the voltage conversion circuit is located in the first high-voltage region, and the voltage conversion circuit is configured to convert the voltage of the first voltage domain into the voltage of the second voltage domain; and
the bond wires are configured to connect an output voltage of the voltage conversion circuit to the second high-voltage region.

15. The drive circuit according to claim 13, wherein the bond wires are directly bonded between a pad of the first high-voltage region and a pad of the second high-voltage region.

16. The drive circuit according to claim 13, wherein a pad of the first high-voltage region is connected to a packaging pin of the drive circuit through the bond wire, and a pad of the second high-voltage region is connected to the packaging pin of the drive circuit through the bond wire, so that electric energy transmission and drive signal transmission are implemented between the first high-voltage region and the second high-voltage region.

17. A power converter, comprising a half-bridge arm and a drive circuit according to claim 1 or at least one drive circuit according to claim 12, wherein
the half-bridge arm comprises a first switching transistor and a second switching transistor;
a first terminal of the first switching transistor is connected to a power supply, a second terminal of the first switching transistor is connected to a first terminal of the second switching transistor, and a second terminal of the second switching transistor is grounded;

the drive circuit is configured to drive an on/off state of each of the first switching transistor and the second switching transistor; and the power converter is configured to perform voltage transformation on the power supply and output a transformed voltage.

* * * * *